US006369727B1

(12) United States Patent
Vincze

(10) Patent No.: US 6,369,727 B1
(45) Date of Patent: Apr. 9, 2002

(54) ANALOG-TO-DIGITAL CONVERSION METHOD OF RANDOM NUMBER GENERATION

(75) Inventor: Andrew J. Vincze, New London, CT (US)

(73) Assignee: RNG Research, New London, CT (US)

( * ) Notice: Subject to any disclaimer, the term of this patent is extended or adjusted under 35 U.S.C. 154(b) by 0 days.

(21) Appl. No.: 09/466,580

(22) Filed: Dec. 17, 1999

(51) Int. Cl.[7] .......... H03M 1/20
(52) U.S. Cl. .......... 341/131; 364/717
(58) Field of Search .......... 341/118, 120, 341/143, 155; 708/250, 256; 364/746, 746.1; 463/22

(56) References Cited

U.S. PATENT DOCUMENTS

| | | | | |
|---|---|---|---|---|
| 5,224,165 A | | 6/1993 | Reinhardt et al. | 380/47 |
| 5,572,454 A | * | 11/1996 | Lee et al. | 364/746.1 |
| 5,696,828 A | | 12/1997 | Koopman, Jr. | 380/46 |
| 5,706,218 A | | 1/1998 | Hoffman | 364/717 |
| 5,732,138 A | | 3/1998 | Noll et al. | 380/28 |
| 5,774,549 A | | 6/1998 | Nielsen | 380/20 |
| 5,778,069 A | | 7/1998 | Thomlinson et al. | 380/25 |
| 5,830,064 A | * | 11/1998 | Bradish et al. | 463/22 |
| 5,905,665 A | * | 5/1999 | Rim | 364/746 |
| 5,961,577 A | | 10/1999 | Soenen et al. | 708/251 |
| 5,963,104 A | | 10/1999 | Buer | 331/78 |

* cited by examiner

*Primary Examiner*—Peguy JeanPierre
*Assistant Examiner*—Joseph J Lauture
(74) *Attorney, Agent, or Firm*—Perman and Green, LLP

(57) ABSTRACT

A random number generator (RNG) using an analog-to-digital (A/D) converter to convert random noise into digital samples which are transformed by a reductive mapping into uniformly distributed random numbers for output. The synchronous RNG may be integrated and is intended for use in all computer systems. A noise source provides random noise from electronic events involving quantum-mechanical uncertainty. A compressor amplifies noise by a level-dependent gain to provide random noise, v (t), with a stabilized standard deviation and allows the output level of a noise source to vary without affecting the output of an RNG. An n-bit A/D converter converts v (t) into a digital random variable, Y. An expedient test of an RNG is to compute the mean and standard deviation of Y. Correlation is precluded by minimizing antialiasing. An interface circuit reduces Y modulo-M, where constant $M \ll 2^n$, and generates random numbers, from 0 to M−1, at the A/D converter sampling frequency.

21 Claims, 11 Drawing Sheets

ANALOG-TO-DIGITAL CONVERSION METHOD OF RANDOM NUMBER GENERATION

BACKGROUND OF THE INVENTION

1. Field of the Invention

The present invention relates to random number generators (RNG) and more particularly to a method and means that uses an analog-to-digital (A/D) conversion process on random noise to produce an output from an analog-to-digital converter and then applies a reductive mapping process to the A/D converter output to transform it into a uniformly distributed random variable.

2. Description of the Prior Art

With the proliferation of digital computers, and the increasing rates at which they operate, an unprecedented demand for random numbers has arisen and accordingly RNGs. The myriad applications which benefit from RNGs are as diverse and ubiquitous as national security and home entertainment, e.g., cryptography and computer games. Earlier, random numbers were needed in order to solve problems by experimental probability procedures run on the first digital computers. The early experimental procedures have since been developed into the sophisticated probabilistic algorithms that are now run on contemporary computing platforms resulting in a corresponding increase in demand. Over the same history, the scope of digital computer applications has expanded manifold, and the advantages provided to these applications by methods which require random numbers continue to be recognized. Of greatest importance in such applications are random sequences which have the uniform probability distribution, the ideal output of computer languages' "random number functions." Accordingly, a measure of RNG quality in this regard is that it have a small bias, i.e., a small difference between the distribution of the RNG output and the uniform distribution. The random physical phenomena employed in implementing RNGs pose unique problems in terms of harnessing the phenomena to provide, as digital signals, the needed uniformly distributed random numbers.

It is, of course, desirable that the numbers provided to a random number application be generated by means which produce actual randomness, since any correlation among them is detrimental. However, the physical phenomena useful for providing rapid, automatic random means present a problem in that they do not exhibit the uniform distribution required of the RNG output. One widely practiced solution is to circumvent this problem by substituting uniformly distributed non-random sequences in lieu of random sequences, whenever practicable. Such pseudo-random sequences are generated by deterministic algorithmic processes, e.g., modular multiplication, which, by careful selection of parameters, yield sequences that are devoid of obvious patterns. Because no random phenomenon is involved, all elements of pseudo-random sequences are, necessarily, causally related and the sequences may be accurately predicted and replicated. This replication property is fundamental for pseudo-random applications, e.g., the RSA cryptosystem (see U.S. Pat. No. 4,405,829), in which the sender uses a modular exponentiation to obscure meaning in transit and the recipient uses an inverse modular exponentiation to regenerate the sender's plaintext. However, for random number applications, this replication property is a liability, since, e.g., in order to maximize security, RSA keys (i.e., exponents and modulus) are generated exclusively by random means.

Several other prior art solutions to the problem generate random time periods as means to randomly select numbers produced by deterministic means. Examples include the so-called "electronic roulette wheel" used to produce Rand's well-known table (see Rand Corporation. (1966) *A Million Random Digits with* 100,000 Normal Deviates,The Free Press. Glencoe Ill.), and the method involving radiology by which, "Random-numbers modulo-M are produced by stopping the rapidly advancing [modulo-M] counter at the random time, determined by an electron arrival of the G-M [Geiger-Mueller] tube [from a sample of $^{90}$Sr]" (see SCHMIDT, H. (1970) "Quantum-mechanical random-number generator", *Journal of Applied Physics,* 41, 462–468). Another recent method in this regard employs user actions, e.g., keystrokes, as means to randomly select numbers from software counters in order to generate cryptographic keys for secure interchange via the Internet. The generation rates provided by the second method are obviously much higher than those provided by the latter method, but the rates are limited to 80,000 bit/sec by an estimated G-M tube limit of 10,000 counts per second. Although random frequency pulses may be produced at high rates by entirely electronic means, to significantly exceed a rate of 80,000 bit/sec would require digital counters that may be clocked at SHF or EHF frequencies, or a cumbersome plurality of slower apparatus.

Further prior art solutions use deterministic means to distort random electronic noise, which is normally distributed, in order to provide a 1-bit random variable. One example subjects the noise to successive stages of clipping, amplifying, and sampling, whereby the normal distribution is thus directly divided in two, with the probability of each fraction mapped to one of the two possible digits (see NELSON, R. D., BRADISH, G. J., and DOBYNS, Y. H. (1989) "Random event generator qualification, calibration and analysis." Princeton University School of Engineering/Applied Sciences; and U.S. Pat. No. 5,830,064). Another example uses a comparator to severely amplify the difference between the instantaneous output of two sources. In practice, maintaining the approximate coincidence of division and median in the former example, and of the two medians in the latter example, within a tolerance that provides a bias as small as the quantum-mechanical RNG, e.g., $<3\times10^{-6}$, necessitates extreme precision and periodic calibration.

It is believed that the limitations of the prior art methods and means have resulted in speed and cost constraints on execution of random number applications which cannot tolerate non-random characteristics. These random number applications include, e.g., cryptographic key generation. The limitations have also resulted in the use of pseudo-random numbers in other applications for which high speed is essential and non-random characteristics may be tolerated, for instance, computer simulations for which unwanted correlation is not catastrophic. Still other applications for which no compromise is feasible have had to be abandoned. Lastly, in the case of probabilistic, "Monte Carlo" methods that may be practiced with pseudo-random numbers, computer resources consumed by pseudo-random generator algorithms represent a reduction of resources to the application itself Consequently, there is a need in the art for a method and means that provide uniformly distributed random number sequences.

Objects:

It is accordingly an object of the present invention to provide an improved method and means of generating random number sequences having uniform distribution.

It is another object of the invention to provide an improved random number generator for use in any situation which benefits from random number sequences.

It is a further object of the invention to provide a high-speed RNG of particularly small bias.

It is a still further object of the invention to provide an electronic RNG which has no periodic calibration requirements.

It is an additional object of the invention to provide an improved RNG for use in applications benefiting from random number sequences, particularly applications wherein it is most preferred that an RNG be fabricated as an integrated circuit (RNG-IC).

It is also an object of the present invention to provide an improved method and means of generating random number sequences that is automatic and free of radiological considerations.

SUMMARY OF THE INVENTION

The present invention is directed to providing an improved method and means for generating random number sequences and particularly as embodied in a random number generator (RNG). The RNG embodiment provides uniformly distributed random number sequences that are usable in a considerable number of applications in the art. The RNG of the invention is of the type known as a "nondeterministic random number generator," i.e., the present invention uses phenomena which are believed to be truly random and there is no known method for predicting or replicating the number sequences it provides. The invention utilizes combinations of four main elements: a noise source, a compressor, an A/D converter, and a "reduction function", i.e., a circuit which performs a reductive mapping process. The preferred embodiment includes all four elements, but other embodiments comprising combinations of a lesser number have demonstrated utility. In accordance with the invention an A/D converter (ADC) is used to produce sequences of voltage (or current) measurements of the output of a source of random noise. Inasmuch as the digital output of the A/D converter is a random variable, this output does provide random sequences of numbers, but the mere combination of the noise source and ADC alone does not constitute a "random number generator", since the term implies a uniform distribution. Preferably, the random noise measured by the A/D converter is produced by applying a reverse-bias to a P-N junction, i.e., a semiconductor noise source, and the A/D converter is a linear converter, which thus outputs random sequences with a normal probability distribution. Alternatively, using a logarithmic, A-law, or other appropriate, A/D converter will provide other distributions, as will non-linear amplification of the noise, or an alternative noise source. The fact that the invention thus provides a method and means for generating normally distributed random sequences, or various alternatives, renders it adaptable for use with special random number applications.

Greater utility is achieved in accordance with the invention by applying a reductive mapping process to the A/D converter output sequences in order to produce random sequences with the uniform distribution and thus provide an RNG. Preferably, this mapping process is a reduction modulo-M, where $M<<2^n$ for an n-bit A/D converter, so that random numbers 0, 1, . . . (M−1) are generated at the A/D converter sampling frequency. Thus the RNG may generate uniformly distributed random number sequences at the high-speeds of available A/D converters. Also, greater efficiency is achieved by using a compressor to amplify random noise. The compressor automatically increases gain for low level (i.e., standard deviation of the voltage or current) input and reduces gain for high level input. By using a compressor to stabilize the standard deviation, the reduction function may use a greater modulus, M, for any given maximum RNG bias, and RNG output rate=($\log_2$ M)(sampling frequency) bit/sec. Thus, in the preferred embodiment, the random noise from the noise source is amplified by the compressor, the amplified noise is provided to the A/D converter for measurement, and the digital measurements are reduced by the reduction function to produce uniformly distributed random sequences, which constitute the output of the RNG. The RNG generates uniformly distributed random sequences of the numbers 0, 1, . . . (M−1) at the A/D converter sampling frequency.

Particular features provided by the invention include the novel use of an analog-to-digital (A/D) conversion process to produce voltage or current measurements of random noise in automatically generating random numbers, obviating any need of radioactive material, so that the RNG may be fabricated either from commercially available parts or as a single integrated circuit (RNG-IC). Also, the novel applying of a reductive mapping (i.e., an R to 1 mapping, R>1) process to digital measurements of voltage or current enables the production of a low cost, high-speed, electronic RNG of particularly small bias. Further, the small bias of such an electronic RNG may be made free from periodic calibration requirements by newly using a signal compressor to amplify the random noise. By using synchronous digital processes, the RNG may be operated synchronously, so that it can be easily iterated into arrays coordinated by interleaving and paralleling methods well-known in the art. A particular embodiment of the invention in a personal computer may comprise a semiconductor noise source, radio-frequency compressor, 16-bit 100,000 sample/sec A/D converter, and computer-bus interface logic that reduces data modulo-256, that form an RNG which is automatic, uses no radioactive material, requires no periodic calibration, and generates random numbers synchronously at a constant rate of 800,000 bit/sec with a bias of less than $3\times10^{-12}$, i.e., three parts per trillion. "Further, the small bias of such an electronic RNG may be made free from periodic calibration requirements by newly using a signal compressor to amplify the random noise. By using synchronous digital processes, the RNG may be operated synchronously, so that it can be easily iterated into arrays coordinated by interleaving and paralleling methods well-known in the art."

DETAILED DESCRIPTION OF THE PREFERRED EMBODIMENT

Figure 1:
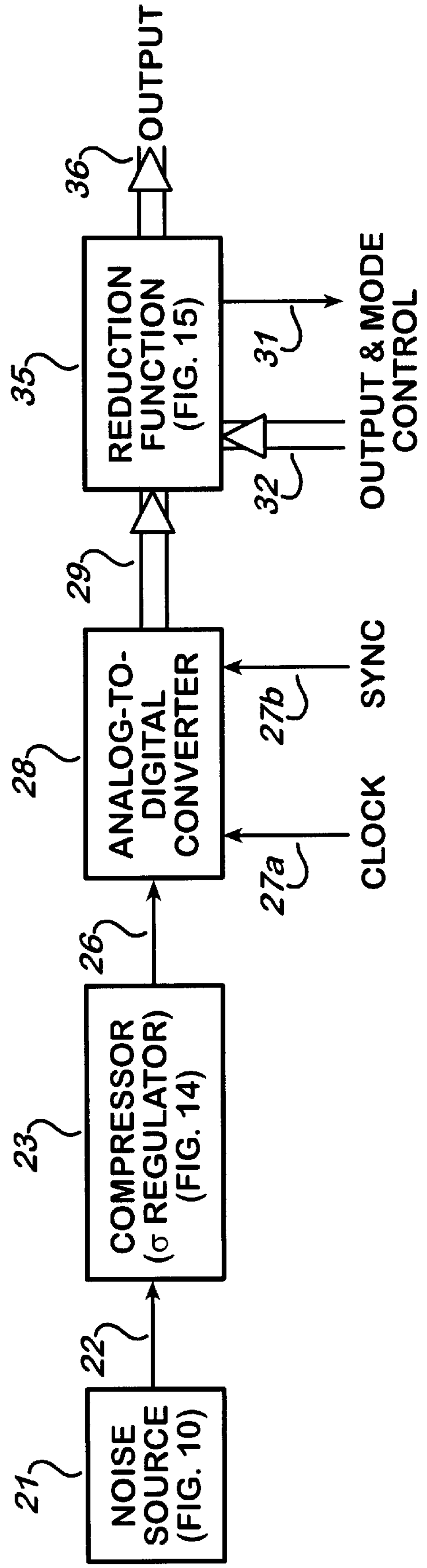
FIG. 1 is a functional block diagram of a random number generator (RNG) in accordance with the present invention.

The present invention involves an improved method and means for providing a random number generator (RNG), using an analog-to-digital (A/D) converter that performs an analog-to-digital conversion process on random noise to produce a digital random variable, and a digital reductive mapping process to transform this random variable into a uniformly distributed random variable. FIG. 1 is a block diagram of an RNG in accordance with a preferred embodiment of the invention, which RNG may be used in all applications which utilize random number sequences. It is believed that the best mode for practicing the invention in the majority of these applications is as embodied in an "RNG-IC:", an integrated circuit (IC) embodying the RNG of FIG. 1. Many of the applications will benefit most from one RNG-IC per IC package, others from a plurality of RNG-ICs within each IC package, and still others from various combinations of RNG-ICs and microprocessors within each IC package. The following description is set forth to enable practicing the invention as embodied in a single RNG which may be iterated into synchronized arrays and may be either assembled from commercially available parts or fabricated as an integrated circuit.

As shown in FIG. 1, the preferred embodiment of the RNG involves the four main elements of the invention, i.e., a noise source 21, a compressor 23, an A/D converter 28, and a "reduction function" 35, which is a digital circuit that performs a reductive mapping process. The four elements are combined in the order shown to form a functional "pipeline." Individually, these four elements may be circuits that are well-known in the art, so that they are shown in block form to clearly distinguish the inventive concepts involved in newly combining them in this manner.

Figure 2:
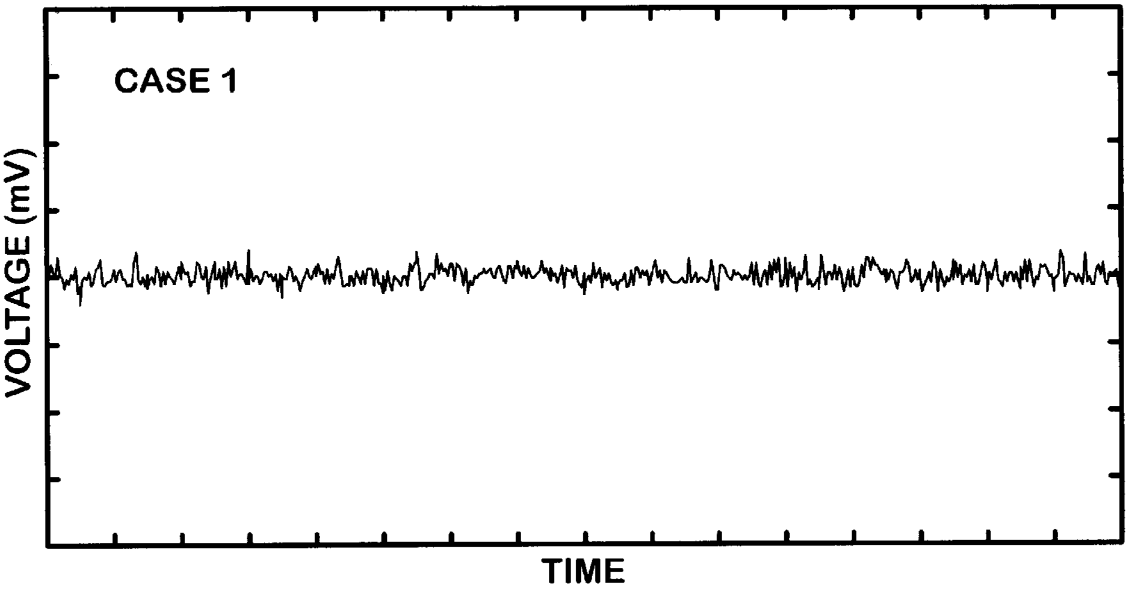
FIG. 2 is an exemplary plot of the output of the noise source in FIG. 1 and, in conjunction with FIGS. 4, 6, and 8, illustrates an exemplary case, "Case 1," of the operation of the RNG of FIG. 1.
Figure 3:
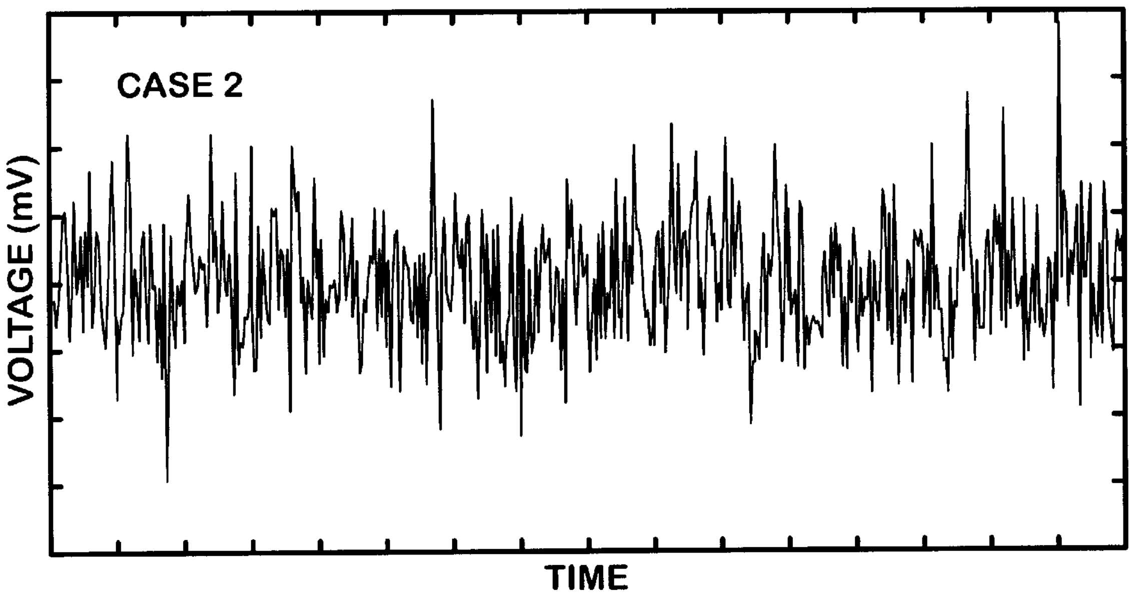
FIG. 3 is an exemplary plot of the output of the noise source in FIG. 1 and, in conjunction with FIGS. 5, 7, and 9, illustrates a second exemplary case, "Case 2," of the operation of the RNG of FIG. 1.
Figure 4:
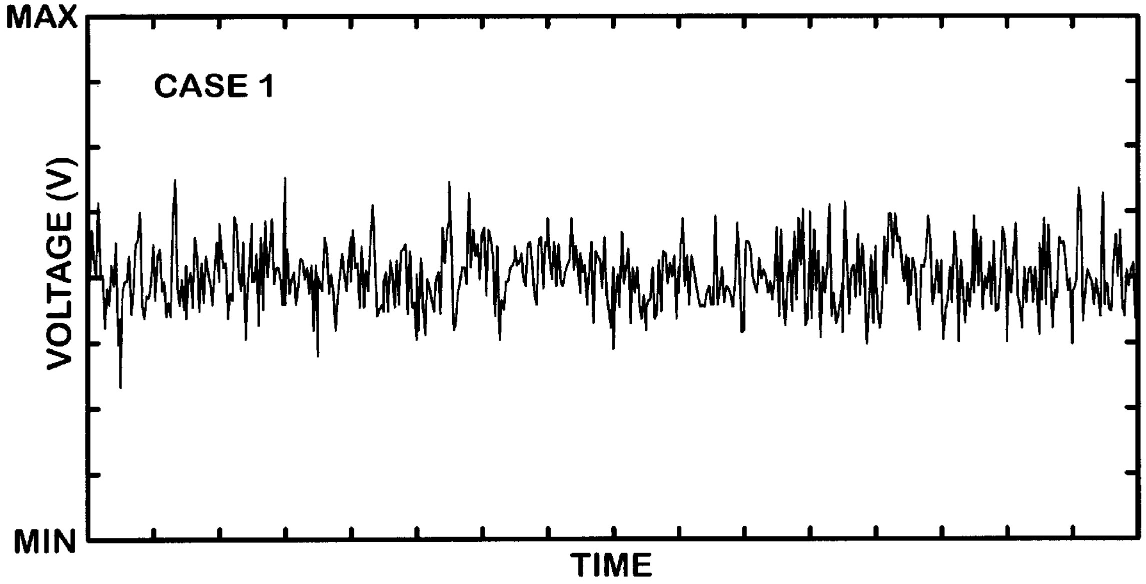
FIGS. 4 and 5 are exemplary plots of the output of the compressor in FIG. 1 for "Case 1" and "Case 2".
Figure 5:
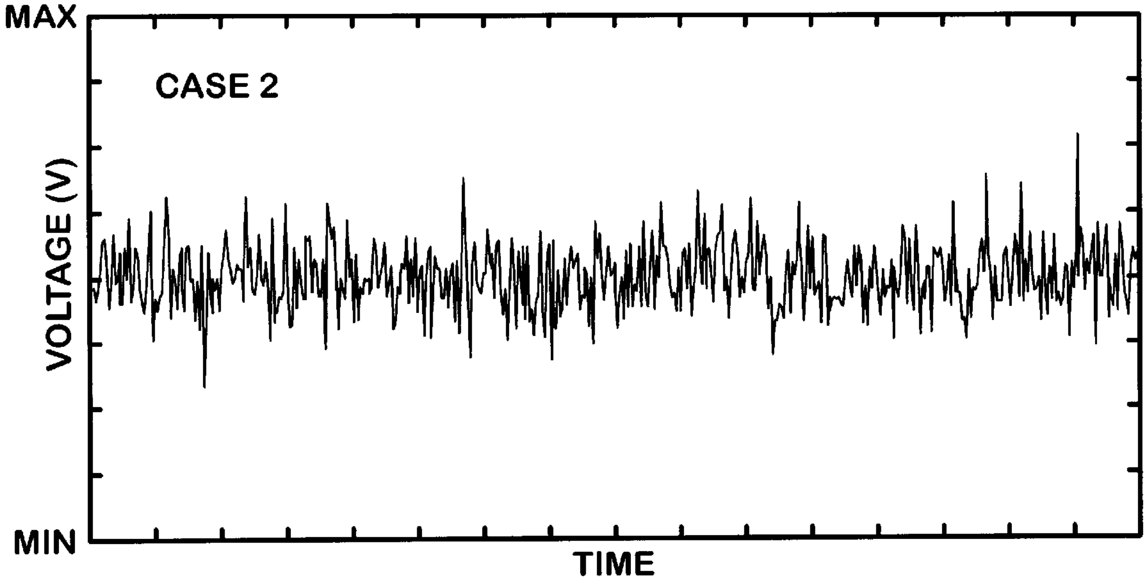
Figure 6:
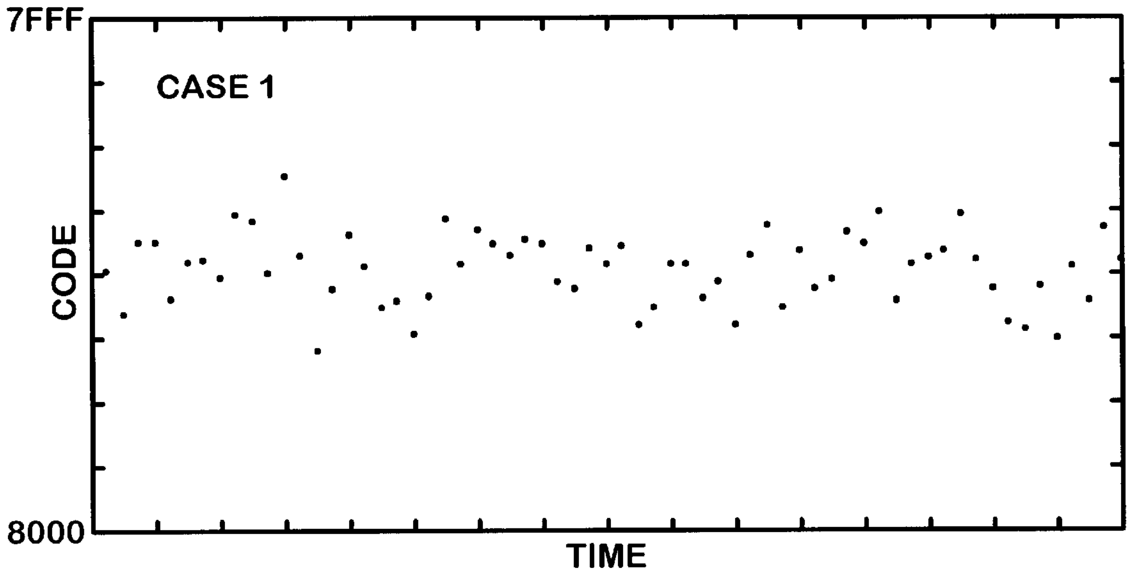
FIGS. 6 and 7 are exemplary plots of the output of the analog-to-digital converter in FIG. 1 for "Case 1" and "Case 2".
Figure 7:
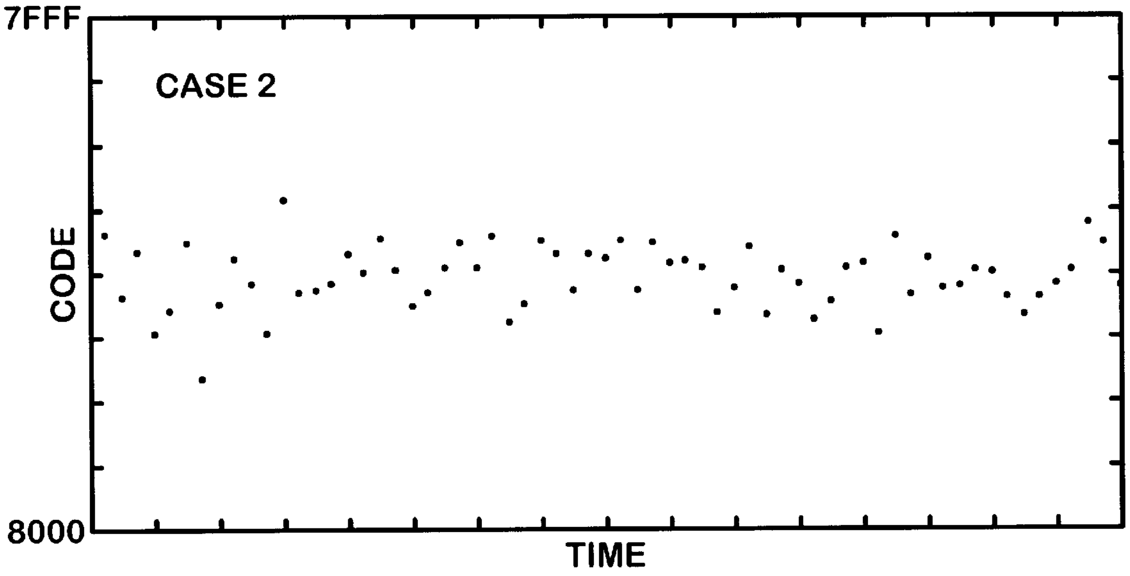
Figure 8:
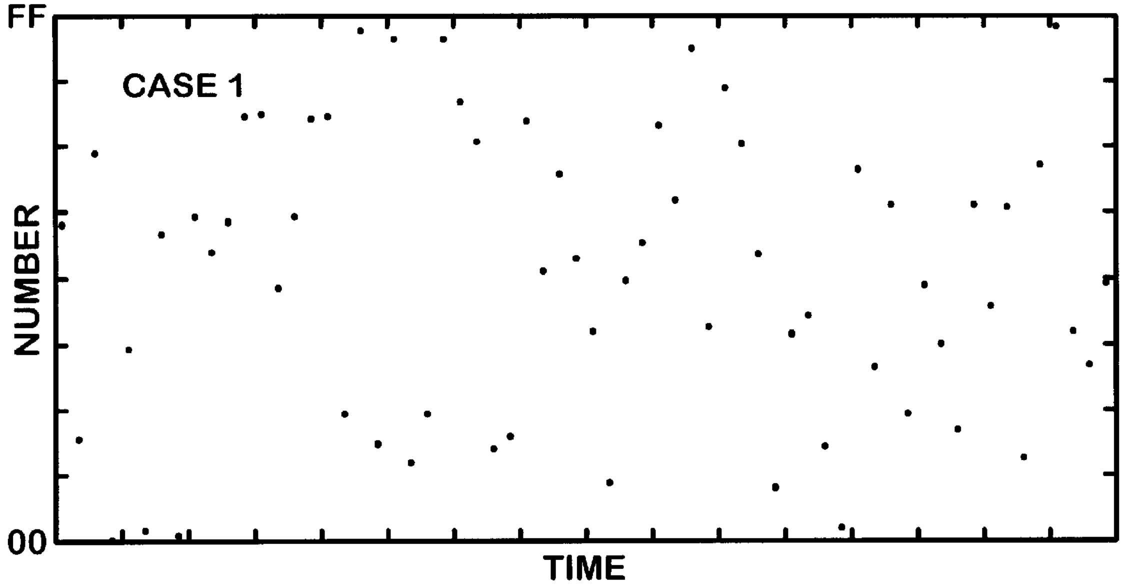
FIGS. 8 and 9 are exemplary plots of the output of the reduction function in FIG. 1 for "Case 1" and "Case 2", which output is the output of the random number generator of FIG. 1.
Figure 9:
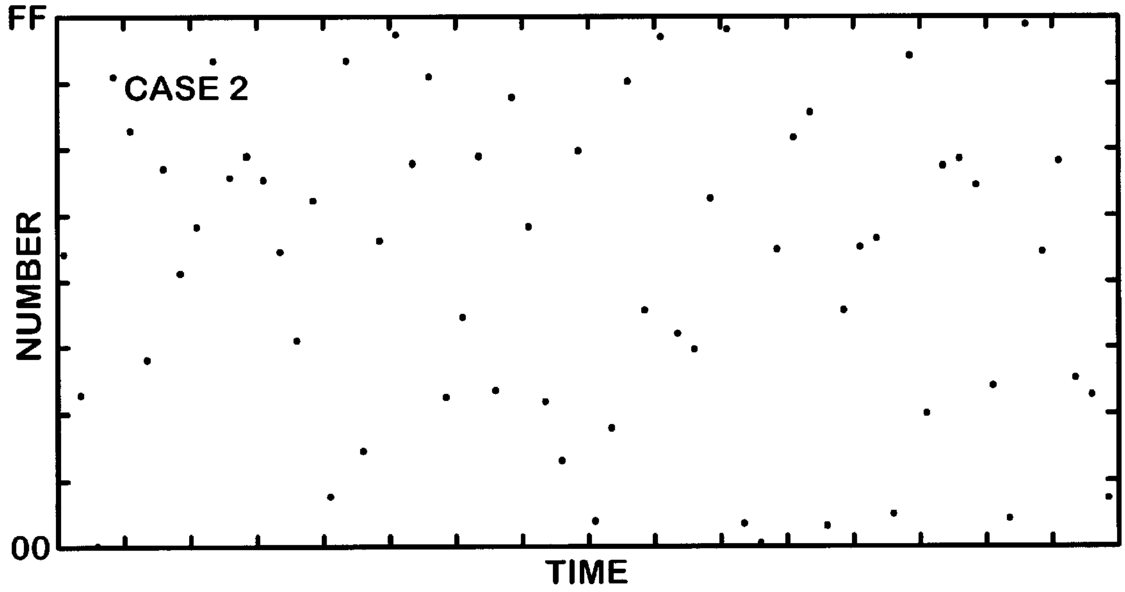

FIG. 2 is an exemplary plot of the output of the noise source 21 in FIG. 1 and, in conjunction with FIGS. 4, 6, and 8, illustrates an exemplary case, "Case 1," of the operation of the RNG of FIG. 1. FIG. 3 is an exemplary plot of the output of the noise source in FIG. 1 and, in conjunction with FIGS. 5, 7, and 9, illustrates a second exemplary case, "Case 2," of the operation of the RNG of FIG. 1. The labels "CASE 1" and "CASE 2" in FIGS. 2 through 9 identify the two exemplary cases of the operation of the RNG. The noise source 21 is a semiconductor noise source, the output 22 of which is represented by FIG. 2, and also by FIG. 3, which represent random noise produced at different times. The noise source output level (i.e., standard deviation of the voltage) is seen to be greater in FIG. 3, which may be attributed to a greater ambient temperature. An exemplary noise source suitable for use in the preferred embodiment is described below, in detail, in conjunction with FIG. 10.

The noise source output provides an input to the compressor 23. The compressor 23 amplifies the noise 22 to produce amplified noise 26 that is represented by FIGS. 4 and 5, which Figures illustrate outputs of approximately equal levels produced by amplifying the noise in FIGS. 2 and 3, respectively, by different gains. An exemplary compressor suitable for use in the preferred embodiment, in the form of a preliminary compressor, and a preferred "level regulator" compressor means, will be described below, in detail, in conjunction with FIGS. 13 and 14, respectively. The compressor noise output 26 is coupled to an analog input of the A/D converter 28 and the voltages labeled "MIN" and "MAX" in FIGS. 4 and 5 indicate the voltages for which the converter 28 will output its minimum and maximum code, respectively. The A/D converter 28 converts the amplified noise 26 into sequences of digital codes. It is presently preferred to use a 16-bit linear A/D converter, which thus produces sequences that are represented by FIGS. 6 and 7, in which Figures each point represents the output from one conversion with the vertical position of the point indicating the numerical value of the code. The minimum and maximum code values are labeled as "8000" and "7FFF," respectively (i.e., bipolar mode, 16-bit twos complement format). As seen in the Figures, the standard deviation of the sequences is determined by the level of the analog input 26 provided by the compressor 23. The A/D converter function may involve any one of a plurality of known methods and means, and commercially available examples are cited below in the detailed description of the novel portions of the A/D converter 28. A clock signal 27*a* and synchronization signal 27*b* are provided as input signals to the A/D converter 28 as described below in conjunction with FIG. 16. The A/D converter output data and interface control signals are provided via multiple digital signal paths 29 to the reduction function 35.

The reduction function 35 may be any circuit which performs a reductive mapping process. The preferred process is to reduce 16-bit data modulo-256, which produces an output, as represented by FIGS. 8 and 9, in the form of plots of the least non-negative residues of 16-bit codes outputted by the A/D converter modulo-256. The minimum, $(00)_{16}$, and maximum, $(FF)_{16}$, residue values are labeled "00" and "FF," respectively. Herein, numerals enclosed in parentheses and subscripted with 16 or 2 indicate hexadecimal or binary notation, e.g. $(0)_{16}=(0)_2=0$, $(FF)_{16}=(1111\ 1111)_2=255$. The preferred type of circuit is a parallel interface which reduces modulo-256 by providing the least significant bytes (LSB) of the 16-bit converter output codes to the utilization device instead of the entire 16-bit words. Interface to the utilization device is facilitated by output and mode control inputs 32 and a data ready output 31 to and from the reduction function 35. Exemplary reduction function means in accordance with the preferred embodiment are described below, in detail, in conjunction with FIGS. 15 and 16. The sequence of LSBs provided by the reduction function output 36 is the 8-bit output of the RNG of FIG. 1, i.e., uniformly distributed random sequences of the numbers 0, 1, . . . 255.

A noise source for use in the present invention preferably provides significant noise power per unit bandwidth up to a frequency significantly higher than the A/D converter sampling frequency, i.e., A/D conversions per unit time, wherein each conversion is of one analog sample, a voltage, to one digital sample, a code. Such noise power is needed in order to assure serial independence in the digital random number sequences, i.e., correlation between samples is precluded by providing that a significant amount of variation occurs in the noise between samples. To the same end, the levels of interference and power supply ripple should be minimized to levels considerably lower than that of the random noise by methods and means well-known in the art. For a full understanding of precisely what is meant herein by "semiconductor noise source" and why its output is believed to be random, an exemplary semiconductor noise source suitable for use in the preferred embodiment will now be described in detail in conjunction with FIG. 10.

Figure 10:
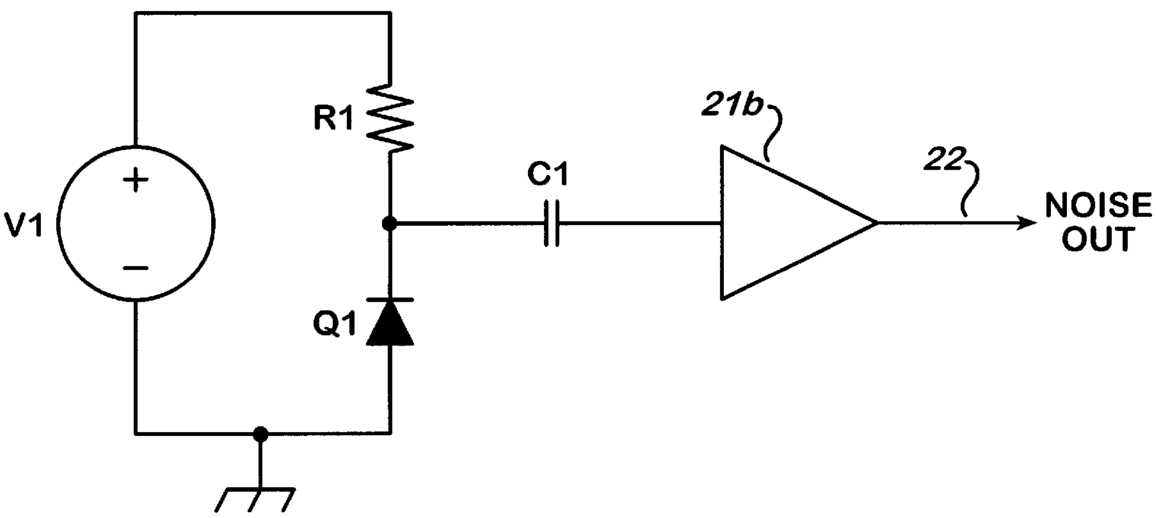
FIG. 10 is an exemplary schematic diagram of the noise source in FIG. 1.

FIG. 10 is an exemplary schematic diagram of a semiconductor noise source in accordance with the prior art that is suitable for use as the noise source 21 of FIG. 1. Voltage source V1 in FIG. 10 represents a well-regulated 12-volt power supply. The noise diode Q1 is a reasonably high quality P-N junction, as may be expediently provided by an MPS2222 transistor. The bias resistor R1 (e.g., 4 MΩ) provides for a reverse current through diode Q1 of approximately one microampere. It is believed that the instantaneous conductance of the noise diode Q1 is a random variable. This is based on the fact that the conductance of a reverse-biased P-N junction at any particular moment is currently understood to be provided by a number of electrons, which, having been thermally excited, at that moment occupy excited energy-states, and by a number of ground states, which at that moment are unoccupied ("holes"). This thermal excitation mechanism accounts for the observed dependence of noise level on noise diode junction temperature. The excitation and "recombination" events occurring at the junction contribute to and detract from the diode's conductance and are understood to be governed by laws of Quantum Physics that intrinsically involve uncertainty (i.e., Heisenberg's uncertainty principle). Although it is not necessary to consider the diode's conductance as a literal summation of random variables assigned to individual electrons (e.g., each variable equals 1 for the excited state and 0 for the ground state), nevertheless, since the Central Limit Theorem holds that such a summation would yield a time-varying random variable with the normal distribution, to do so provides some insight into why the conductance is both random and normally distributed. It is believed that the instantaneous conductance of the noise diode is a net effect of a large number of random variables.

Accordingly, the instantaneous voltage at the cathode of the noise diode Q1 is a random variable which depends on the voltage of the voltage source V1, the resistance of the resistor R1, and the randomly varying conductance of the diode Q1. The cathode of the diode Q1 is AC-coupled by a capacitor C1 to a high-impedance input of a pre-amplifier 21*b*, e.g., a linear amplifier with a gain of 100 designed around the TL082 operational amplifier, the output of which preamplifier is the noise source output 22.

The output 22 of the noise source 21 is an analog random variable with the normal distribution, the standard deviation of which is dependent on noise diode junction temperature. Linear amplification of this analog variable will result in another analog variable with the normal distribution, the standard deviation of which is the product of the standard deviation of the first variable and the amplifier gain. With AC-coupling, the mean of analog random variables is controlled by voltage-biasing. Linear A/D conversion of a normally distributed analog random variable will result in a normally distributed digital random variable, the standard deviation and mean of which are determined by the standard deviation and mean of the analog variable. Hence, the output 29 of the A/D converter 28 of FIG. 1 comprises a discrete random variable, Y, with the normal distribution, the standard deviation of which is determined by the standard deviation (i.e., level) of the inputted noise 26, and the mean of which is determined by the analog input voltage-biasing.

The compressor 23 is used in the preferred embodiment to linearly amplify the output 22 of the noise source by a gain which is dependent on level, such that the compressor output 26 is amplified random noise with an approximately constant level (i.e., the compression ratio is exceedingly high). In this way, noise diode junction temperature is allowed to vary with ambient temperature, and level variations in the A/D converter input 26 are minimized, so that the standard deviation of Y is stabilized, whether level variations in the noise 22 are caused by temperature or otherwise caused.

While the manner of compressing intelligent signals is well-known in the art, e.g., noise rejection systems for audio media, the manner of compressing unintelligent random noise, particularly for the purpose of generating random numbers, is believed to be unexplored in the art and thus offers an opportunity for novel methods. In the present invention, compression is used to stabilize the standard deviation of the normal probability distribution (see FIG. 11) of the A/D converter output variable, Y, which distribution is transformed by the reduction function into a uniform probability distribution (see FIG. 12) for RNG output. Controlling the statistical parameters of Y controls the RNG bias yielded by the deterministic mapping process. To avoid any ambiguity with this departure from conventional purpose, the compressor 23 is stated to sense and determine level and an exemplary compressor in accordance with the prior art suitable for use in the present invention is shown in FIG. 14. However, before describing the details of FIG. 14, the compression principle involved is most clearly explained by a description of the preliminary example shown in simplified schematic form in FIG. 13.

Figure 13:
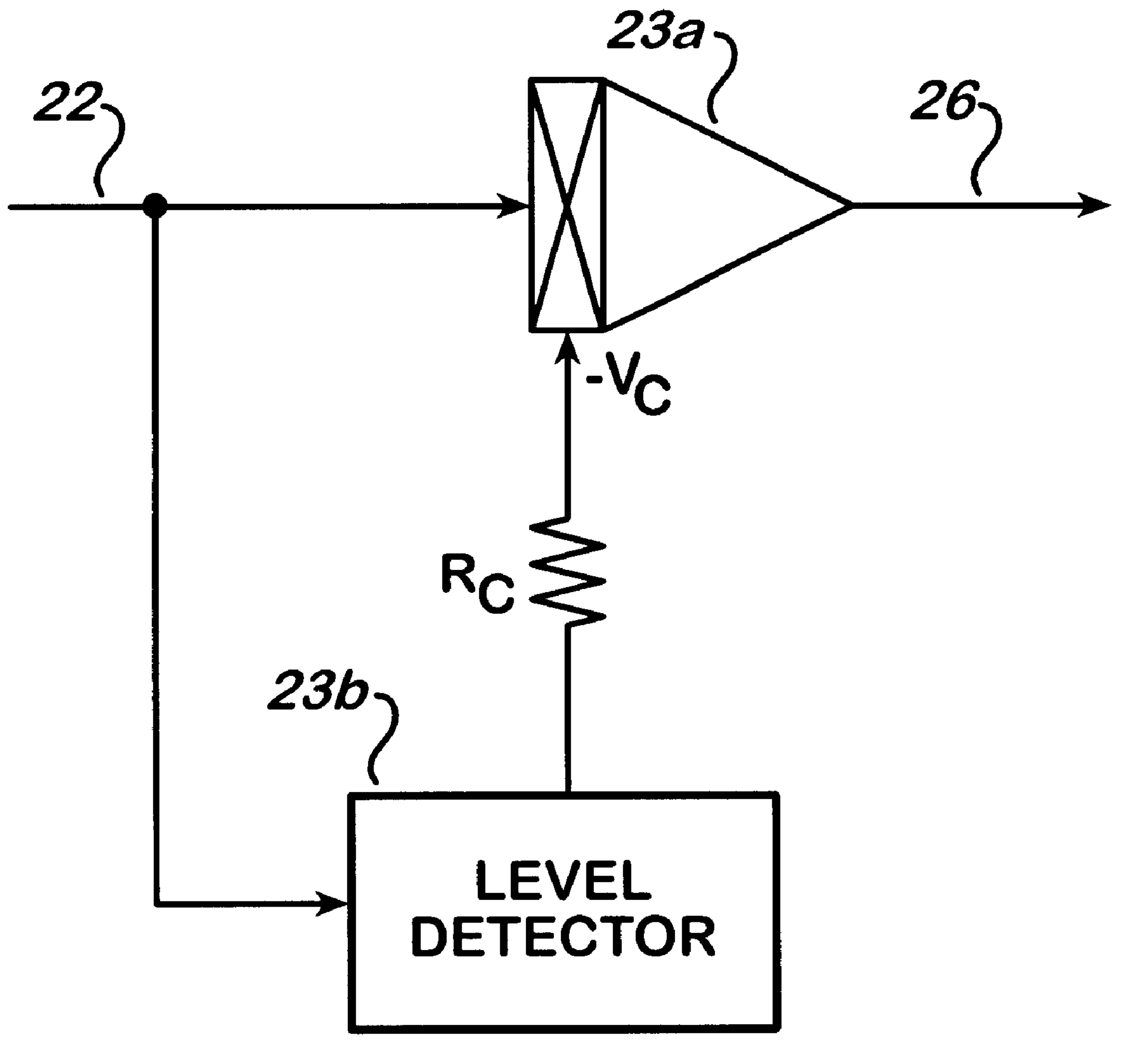
FIG. 13 is an exemplary diagram of a compressor which may be used in the present invention.
Figure 14:
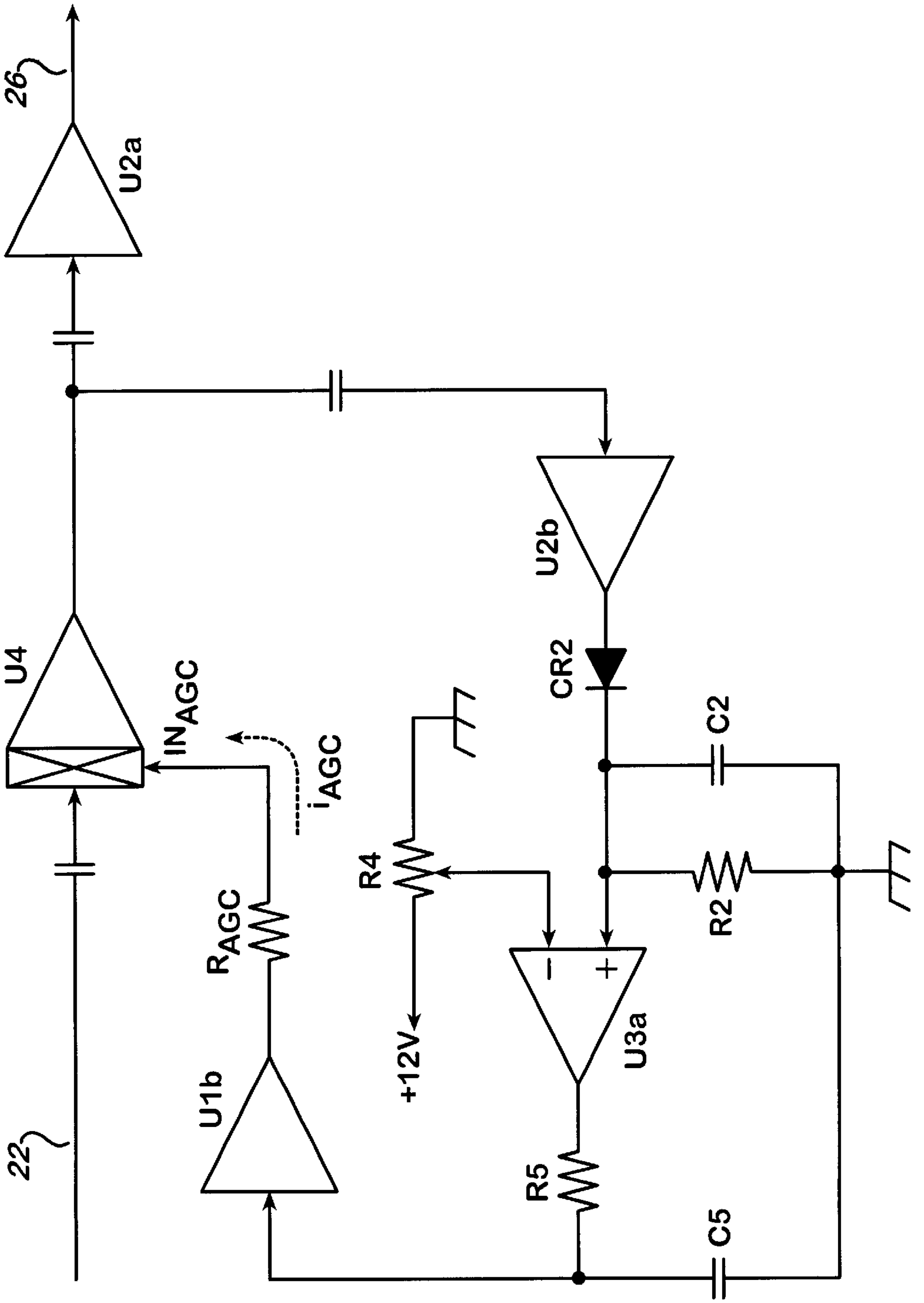
FIG. 14 is a schematic diagram of the preferred compressor employed in the RNG of FIG. 1.

The type of compressor shown in FIG. 13 is well-known in the art, and the values of the resistor $R_C$ for particular compression ratios and the particular additional components not shown will be readily apparent to those of skill from careful study of the manufacturer's data sheets for the voltage controlled amplifier (VCA) 23*a* and the level detector 23*b*. In this example, the random noise 22 from the noise source 21 is directed to high-impedance inputs of both the VCA 23*a* and the level detector 23*b*, which may be two sections of one dynamic range processor, e.g., Analog Devices SSM-2120 dynamic range processor. The level detector 23*b* performs full-wave rectification, logging, and averaging to provide a signal proportional to the log of the level of the input, which signal, via resistor $R_C$, provides a control voltage to the negative control-voltage input $-V_C$ of the VCA 23*a*. The VCA 23*a* amplifies the inputted noise 22 by a gain determined by this control voltage $-V_C$, e.g., −6 mV/dB, to provide amplified noise at the compressor output 26. Depending on the particular VCA, level detector, and A/D converter selected for the components 23*a*, 23*b*, and 28, it may be necessary to amplify the VCA output to provide a compressor output 26 at the level desired for input to the A/D converter 28. It is preferred that the compressor 23 be supplied by the same single voltage supply as the noise source 21, e.g., +12 V. The VCA 23*a* may be a Motorola MC1490 RF/IF/audio amplifier and the radio frequency (RF) compressor may be typical of automatic gain control (AGC) synthesis means in single side-band, suppressed carrier, AM radio receivers by being similar to the example audio compressor presented in "Revision 5" of Motorola's product data sheets, wherein resistor "R3" sets the compression ratio.

Turning to FIG. 14, a preferred compressor for the compressor 23 in FIG. 1 is shown in detail. This compressor provides a unique solution to providing a VCA output level stabilized at the level desired for input to the A/D converter 28. It is intrinsic to this compressor that the nominal output level is selectable and that the compression ratio is not, i.e., it is always exceedingly high. As such, the compressor of the preferred embodiment is a significant departure from conventional compressor methods and means described above, with a feedback control method akin more to switching regulator methods for regulating DC-voltage than to conventional compressor methods. Thus, it should be understood that in terms of its operating principles, the preferred compressor may be considered as more a "level regulator" than a compressor. This consideration will make clear why this circuit is preferred, as the purpose of the compressor is to render constant (i.e., regulate) the standard deviation of the probability distribution of the A/D converter output variable by "regulating" the level of the analog input.

All components in the preferred compressor are supplied by the same single voltage supply as the noise source 21, e.g., +12 V. Several passive components are not shown in FIG. 14 in the interest of clarity. The locations of input biasing resistors for amplifiers U2*a* and U2*b* will be apparent to one skilled in the art, and the VCA U4 may be configured as, e.g., a MC1490 video amplifier circuit as per "Revision 5" of Motorola's data sheets for the product. Amplifiers U1*b,* U2*a,* U2*b,* and U3*a* may all be TL082 operational amplifiers.

In operation, random noise 22 from the noise source 21 is AC-coupled to an input of the VCA U4, which amplifies the noise by a gain determined by the current $i_{ACG}$provided to its gain control input $IN_{AGC}$. The output of the VCA U4 is AC-coupled to an input of isolation amplifier U2*a* which, configured as a unity-gain voltage-follower, provides the amplified random noise 26 to the A/D converter 28 while isolating the VCA output from the A/D converter analog input impedance. The output of the VCA U4 is also AC-coupled to the input of unity-gain voltage-follower U2*b,* which input is biased by a fixed resistive divider to, e.g., +6 V. When the instantaneous voltage of the random noise at the input of follower U2*b* exceeds the sum of the voltage across capacitor C2 and the forward voltage drop of diode CR2, follower U2*b* rapidly charges capacitor C2 via diode CR2. At all other times, diode CR2 isolates capacitor C2 from follower U2*b,* so that capacitor C2 slowly discharges through resistor R2. This half-wave rectifier and filter thus constitute a peak detector, the output of which is coupled to the non-inverting (+) input of comparator U3*a*. The inverting (−) input of comparator U3*a* is provided with a reference voltage (e.g., greater than +6 V) from multi-turn potentiometer R4, so that comparator U3*a* outputs +12 V, when the output of the peak detector exceeds the reference (i.e., positive level-error), and outputs 0 V when it is below the reference (i.e., negative level-error). Comparator U3*a* thus provides a random frequency, pulse-width modulated signal indicative of the probability of the instantaneous voltage of the noise at the input of follower U2*b* to exceed the reference voltage, which is an indirect measure of the level at the output of VCA U4. This error signal is integrated by resistor R5 and capacitor C5. The slowly varying output of this integrator, R5, C5, is provided to unity-gain voltage-follower U1*b,* and the gain control current $i_{AGC}$ results from the voltage thus provided across resistor $R_{AGC}$.

When the level of the noise 22 input to VCA U4 increases, the level of the output of VCA U4 initially increases proportionally. This proportional increase causes increases in the frequency, magnitude, and duration of random excursions above the reference voltage of the instantaneous voltage at the input of follower U2*b,* which increases these tendencies in the peak detector output. This causes the average frequency and width of the random pulses output by comparator U3*a* to increase. The generally more frequent and wider pulses, integrated by resistor R5 and capacitor C5 and buffered by follower U1*b,* provide a greater potential across $R_{AGC}$thus developing a greater current $i_{AGC}$. The greater current reduces the gain of the VCA U4. The system reaches an equilibrium with a very slightly greater output level. For a decrease in input level, equilibrium is reached with a very slightly lesser output level. The output level is thus maintained approximately constant. The use of the comparator, U3*a,* and integrator, R5, C5, to seek an equilibrium in this way eliminates any need to compensate for the non-linear relationship between current $i_{AGC}$ and gain for the VCA, such as the MC1490, and it allows the output of follower U1*b* to range from 0 V to supply voltage, which assures that the entire range of gain control e.g., 60 dB, is usable. This also allows the use of a peak detector, i.e., filtered half-wave rectifier, CR2, C2, R2, as opposed to a more complex level detector circuit.

After assembly of the RNG in accordance with the invention as shown in FIG. 1, sequences of the n-bit A/D converter output 29 are collected, their standard deviations are computed, and potentiometer R4 (FIG. 14) is adjusted to produce standard deviations of approximately $2^n/16$ codes before the apparatus is put into service. The level preferred for input to the A/D converter 28 is thus defined as that which results in the preferred standard deviation of $2^n/16$ codes. The tolerance of the RNG of the invention is relatively wide with respect to the precision provided by the compressor 23, so that no further calibration is required. For an RNG-IC, all the resistors in the feedback section, including potentiometer R4, may consist of fixed, precision integrated resistors of the type normally manufactured in digital-to-analog converter ICs available in the art. As additional design considerations, distortions which may lead to causal relationships between samples of the compressor output, e.g., intermodulation distortion, should be minimal and, preferably, the compressor frequency response should be greater than the A/D converter sampling frequency in order to assure serial independence.

Generally in the art A/D conversion is divided into three constituent functions: antialiasing, e.g., a low-pass filter; track-and-hold, e.g., a Burr-Brown SHC5320KP; and, a traditional A/D converter, e.g., a Burr-Brown PCM78P. The antialiasing filter follows from the Nyquist Criterion: In order to produce a set of samples that accurately describes a signal, the highest frequency component of the signal must be no greater than one-half of the sampling frequency. Thus, at least two points are sampled from each cycle, e.g., a sine-wave of any higher frequency ("out-of-band") would yield a set of samples that indicates it to be of a lower frequency, i.e., it would be aliased into the band. Complex filters, with a cutoff frequency no greater than one-half of the sampling frequency, are therefore normally used for this function. For the second of the three functions, the track-and-hold buffer follows from the non-zero A/D conversion time, during which the particular voltage of an analog sample must be held in order to yield an accurate digital sample. The track-and-hold buffer performs the sampling, which quantizes time only, while in the third function, the traditional A/D converter quantizes and digitizes the particular voltage of each analog sample.

The A/D converter 28 of the present invention comprises track-and-hold and traditional A/D converter functions in order to produce number sequences in which each element, separately, is one accurate digital sample of the inputted noise. The Nyquist Criterion, however, is preferably violated in order to ensure serial independence. Contrary to conventional A/D conversion methodology, it is not an object of the invention to produce sequences that accurately describe the sampled phenomenon. Rather, the invention is directed to producing serially independent random sequences. The violation is shown in FIGS. 4 through 7, wherein FIGS. 6 and 7 show samples that are separately accurate, but the sets do not accurately describe the noise in FIGS. 4 and 5. The Criterion may be violated intrinsically by minimizing anti-aliasing in the practice of the invention and/or extrinsically by discarding digital samples, i.e., utilizing numbers at a divisor of the sampling frequency.

Maximizing the RNG output rate, ($\log_2$ M)(sampling frequency) bit/sec, requires maximizing the modulus, M, of the reduction function and, as shall be explained below, minimizing the RNG bias requires maximizing the ratio of the A/D converter resolution to M, so that greater converter resolutions are preferred. The preferred resolution is 16 bits, because currently high quality, high speed, 16-bit converters are commercially available at relatively low cost. The invention provides an RNG bias $<3\times10^{-12}$ with a compressor, 16-bit linear A/D converter, and $M=2^8$; and an 8-bit RNG output is particularly suitable for use in digital computers. It is also preferred to use a 16-bit sigma-delta A/D converter that operates from a single +5V supply, that may be synchronized, and that includes an on-chip voltage reference, e.g., an Analog Devices AD776 16-bit, 100 kSPS (kilo-sample per second), oversampling ADC. The analog and digital supplies may be obtained from a single +5 V source by simple decoupling methods well-known in the art and the sigma-delta oversampling architecture needs no external track-and-hold buffer. The A/D converter 28 in FIG. 1 may thus be a linear, 16-bit, sigma-delta oversampling A/D converter operating from a single +5V supply and providing its own reference voltage, as will be described in the manufacturer's data sheets for the particular converter selected. For use in an RNG array in accordance with the invention, each converter may provide its own reference voltage. The voltage-bias at the A/D converter input determines the mean of the converter output sequences and is preferably to the center of the scale. This may be done by using a single-ended input circuit, e.g., as described in the manufacturer's data sheets for the AD776. Adequate control over the mean may be readily attained by the use of 1%-tolerance resistors in this input circuit.

Figure 11:
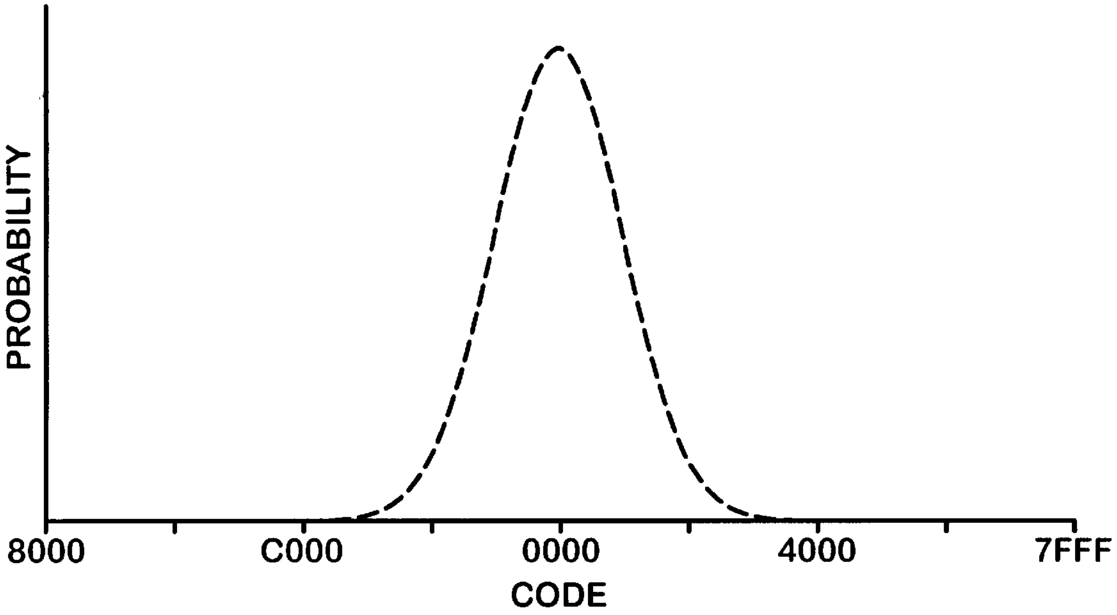
FIG. 11 is a representation of the probability distribution function (PDF) of the output of the analog-to-digital converter in FIG. 1.
Figure 12:
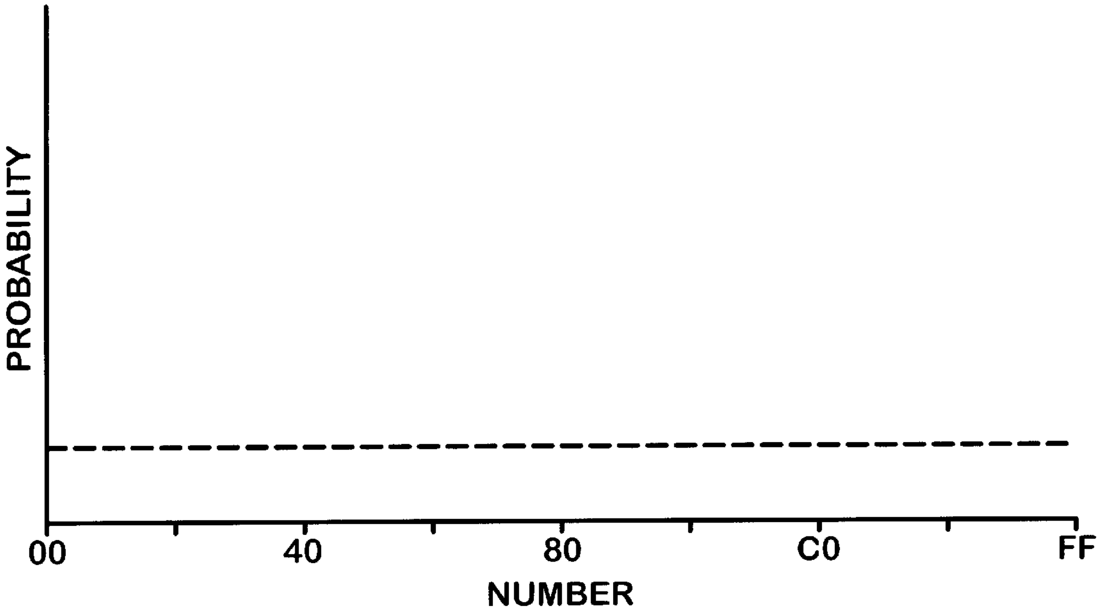
FIG. 12 is a representation of the PDF of the output of the RNG of FIG 1.

The output of the A/D converter 28 is a discrete random variable, Y. The probability distribution function (PDF) of Y for the preferred embodiment is shown in FIG. 11, wherein the labels "8000," "C000," "0000," "4000," and "7FFF" represent the quantities $-(8000)_{16}$, $-(4000)_{16}$, 0, $(4000)_{16}$, and $(7FFF)_{16}$, respectively, in industry-standard 16-bits twos complement format. As seen in the Figure, Y has the normal distribution with a mean, $\mu$, of $0=(0)_{16}$ and a standard deviation, σ, of $2^{16}/16=4{,}096=(1000)_{16}$. For an unbound quantization (i.e., $-\infty<Y<\infty$), the probability, P, of Y equaling any particular integer, y, is a definite integral of the continuous normal PDF given by:

$$P(y)=\int_y^{y+1}(2\pi\sigma^2)^{-1/2}\exp[-(v-\mu)^2/2\sigma^2]dv. \tag{1}$$

Minimum and maximum integers, a and b, bound the real A/D converter which outputs integer Y, $a\leqq Y\leqq b$, so that for all integers y, $a<y<b$, the probability is P (y), but for y=a and for y=b the probabilities are greater than P (y) by amounts, $\epsilon_y$, equal to the off-scale-low and off-scale-high input probabilities, given by $$\epsilon_a=\sum_{y=-\infty}^{a-1}P(y) \tag{2}$$

and $$\epsilon_b=\sum_{y=b+1}^{\infty}P(y). \tag{3}$$

The described methods of controlling the standard deviation and mean provide that a and b ("8000" and "7FFF," respectively, in FIGS. 6, 7, and 11) are near a nominal eight standard deviations from the mean (i.e., z=±8), so that $\epsilon_a$ and $\epsilon_b$ both remain less than $8\times10^{-13}$ ($|z|\geqq8$, one-tailed). Because a 2.5%-of-scale shift in $\mu$, or a 5% increase in σ, ($|\Delta\epsilon_y|\cong1.5\times10^{-14}$) does not cause these terms to exceed $8\times10^{-13}$ ($|z|\geqq7.6$, one-tailed), the tolerances of the invention are relatively wide. By declaring additional $\epsilon_y$'s, for all other allowed y, such that $$\epsilon_y=0\ (a<y<b), \tag{4}$$

the probability of all integers y, $a\leqq y\leqq b$, may be stated concisely as P (y)+$\epsilon_y$.

For bipolar mode (i.e., a<0), the twos complement format output is the least non-negative residue of Y mod (b−a+1), which, for a 16-bit converter, may be represented by four hexadecimal digits, $(h_3h_2h_1h_0)_{16}$, where $0\leqq(h_3h_2h_1h_0)_{16}\leqq(FFFF)_{16}$. For unipolar moded (i.e., a=0), the straight binary format output is Y, and Y is, itself, the least non-negative residue of Y mod(b−a+1).

Now, it is preferred that the reduction function output X, is such that X≡Y mod M. By selecting M to be an integer power of 2, $M=2^m$, the least non-negative residue of Y mod M may be easily obtained by using the well-known logic operator "AND," i.e., $X=(h_3h_2h_1h_0)_{16}$ AND $(2^m-1)$, wherein each binary digit of X is the result of a Boolean AND of the same-ordered binary digits of the operands, e.g., $(h_3h_2h_1h_0)_{16}$ AND $(2^8-1)=(h_3h_2h_1h_0)_{16}$ AND $(0000\ 0000\ 1111\ 1111)_2=(h_1h_0)_{16}$. In the preferred embodiment, $M=2^8=256$, the reduction function process is $X=(h_3h_2h_1h_0)_{16}$ AND $(2^8-1)$, and X is thus the least significant byte (LSB) of the 16-bit A/D converter output.

Given N=b−a+1, the interval of Y, $a\leqq Y\leqq b$, is thus divided into N/M equal subintervals of M integers ([a, a+M−1], etc.), which subintervals may be indexed by integer k. All particular y's are thus an x-th integer on a k-th subinterval, and all y's that are the x-th integer on any subinterval are mapped by the reduction to x. The probability, p, of the random variable X equaling any particular integer, x, is thus the sum of the probabilities of all y that are mapped to x and is given by $$p(x)=\sum_{k=0}^{N/M-1} P(a+kM+x)+\epsilon_{a+kM+x}\quad (0\le x<M). \tag{5}$$

Given an A/D converter scale, a≦Y≦b, a mean, $\mu$, standard deviation, $\sigma$, and reduction modulus, M, Equations 1 through 5 may be used to compute the probabilities p (x) for the output variable, X, of various embodiments of the invention, provided, of course, that the noise is normally distributed and (b−a+1) is a multiple of M, as is the case for the preferred embodiment. More general equations for alternative embodiments may be derived from the quantization, boundary, and reductive mapping principles explained herein.

The preferred reductive mapping process implicitly divides the PDF of Y into N/M consecutive parts, each comprising M particular probabilities. In the preferred embodiment, the PDF of Y in FIG. 11 is divided into 256 consecutive parts, each comprising 256 particular probabilities. The probability mapped to a particular x is the sum of 256 particular probabilities, specifically, one probability from each of the parts, i.e., p (0) is the sum of all the parts' $0^{th}$ probabilities, p (1) the sum of the $1^{st}$ probabilities, etc.

Provided that N/M>>1, a plot of the N/M particular probabilities that are summed for any particular p (x) will describe the shape of the PDF of Y and, furthermore, the sum of these probabilities is very near 1/M. The manner of dividing intervals into large numbers of subintervals is related to the Integral Existence Theorem, which may be used to prove three limits involved in the principles of the invention:

$$\lim_{\sigma\to\infty} p(x)=1/M-(\epsilon_a+\epsilon_b)/M+\begin{cases}\epsilon_a & \text{for } x=0,\\ 0 & \text{for } 0<x<M-1,\\ \epsilon_b & \text{for } x=M-1.\end{cases}$$

For large $\sigma$ and small $\epsilon_a$ and $\epsilon_b$ boundary terms, p (x)≡1/M for all outputted x. As described above, the methods and means for maintaining the boundary terms small ($<8\times10^{-13}$) involve a preferred nominal standard deviation, $\sigma$=N/16, and mean, $\mu$=a+N/2. Approximate nominal output probabilities for ten embodiments in which M=4 (lim p (0)=lim p (3)<$0.25+4\times10^{-13}$, lim p (1)=lim p (2)>$0.25-4\times10^{-13}$) illustrate the approach to the limits as follows:

| σ | N = 16σ | CONVERTER RESOLUTION | p (0) | p (1) |
|---|---|---|---|---|
| 0.5 | 8 | 3-bit | 0.477295 | 0.022756 |
| 1.0 | 16 | 4-bit | 0.342727 | 0.157323 |
| 1.5 | 24 | — | 0.269857 | 0.230193 |
| 2.0 | 32 | 5-bit | 0.252314 | 0.247736 |
| 2.5 | 40 | — | 0.250168 | 0.249882 |
| 3.0 | 48 | — | 0.250030 | 0.250020 |
| 3.5 | 56 | — | 0.250021 | 0.250022 |
| 4.0 | 64 | 6-bit | 0.250010 | 0.250012 |
| 4.5 | 72 | — | 0.250003 | 0.250004 |
| 5.0 | 80 | — | 0.250001 | 0.250001 |

Naturally, changes in $\mu$ and $\sigma$ affect all P (y) for finite A/D converter resolutions. Therefore, worst possible cases for the tolerances of a particular embodiment should be computed. Such computation for the preferred embodiment (M=256, $\sigma$≡4,096, N=65,536) indicates that p (X) has the uniform distribution over the interval 0≦X≦255 to within three parts per trillion.

Figure 15:
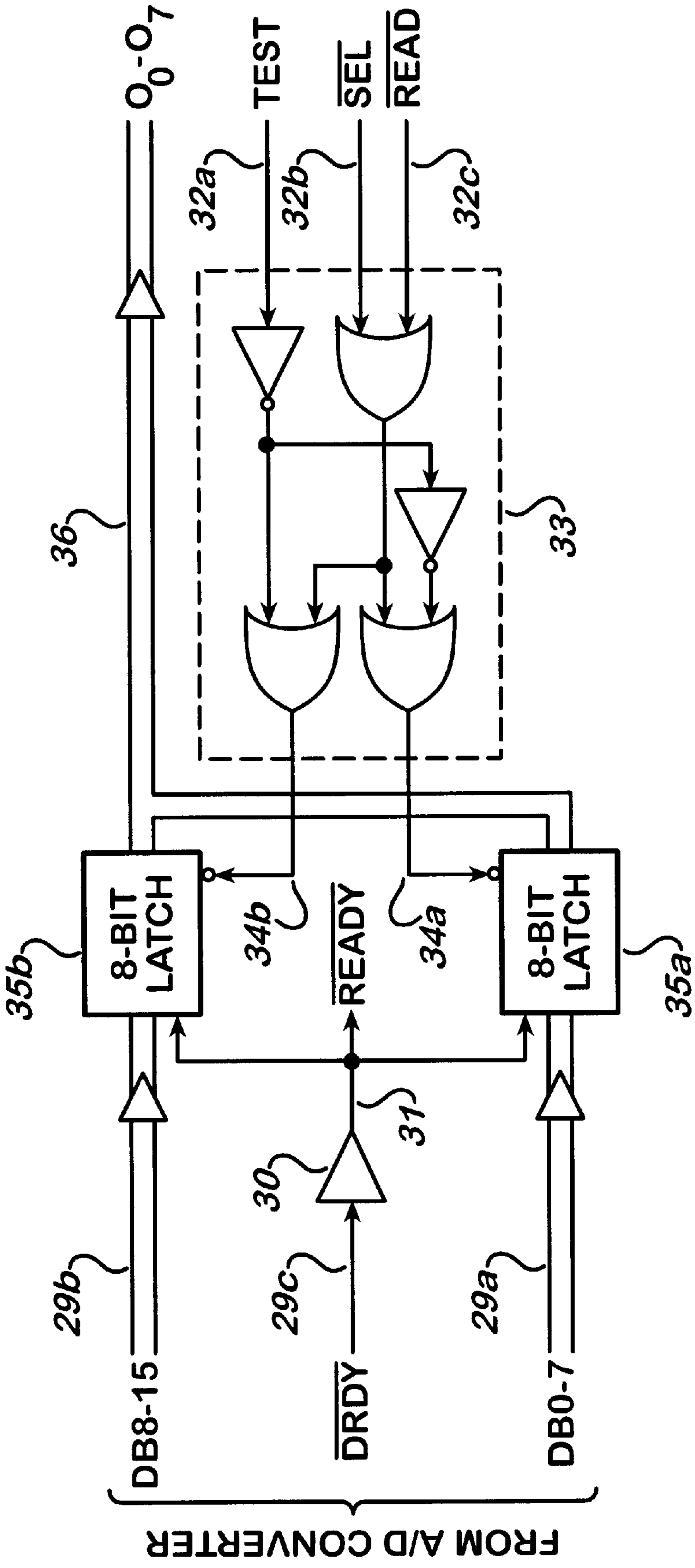
FIG. 15 is a schematic diagram of an exemplary reduction function, involving the preferred RNG-interface signals, which may be used in the RNG of FIG. 1.

FIG. 15 is an exemplary diagram of the preferred reduction function. For this example, the A/D converter 28 in FIG. 1 may be an Analog Devices AD7722 16-bit, 195 kSPS, CMOS, Sigma-Delta A/D converter, configured for bipolar mode operation and providing 16-bit parallel data output and a ready signal via path 29. The converter 28 is driven by a CLOCK signal 27*a,* and may be synchronized by applying a pulse to the SYNC input 27*b*. CS# and RD# converter inputs (not shown) are permanently grounded so that data output lines DB0 through DB15 are always active. (Herein, the symbol # is used to indicate that a signal is active-low.)

The LSB of the 16-bit A/D converter output variable is provided via a data selector involving two 8-bit latches 35*a* and 35*b* with three-state outputs (e.g., 74ACT374). When conversion data on DB0–DB15 becomes valid, the A/D converter 28 will bring data ready DRDY# signal 29*c* to a logic low. When a conversion is completed, the converter will bring signal 29*c* high prior to updating DB0–15. READY# 31 is a buffered data ready signal provided by buffer 30, which is used to store the states of DB0–DB7 (LSB), via path 29*a,* in latch 35*a* and DB8–DB15 (MSB), via path 29*b,* in latch 35*b* on the low-to-high transition of READY#.

Combinational logic 33 is used to generate output enable signals 34*a* and 34*b*. The TEST input 32*a* determines which latch will drive the output bus 36 when the SEL# 32*b* (device select) and READ# 32*c* inputs are both low: If TEST is low (normal mode), then 34*a* will be brought low, so that the LSB stored in latch 35*a* is provided on data output lines $O_0$ through $O_7$, whereas, if TEST is high (test mode), then 34*b* will be brought low instead, so that the MSB stored in latch 35*b* is provided.

Figure 16:
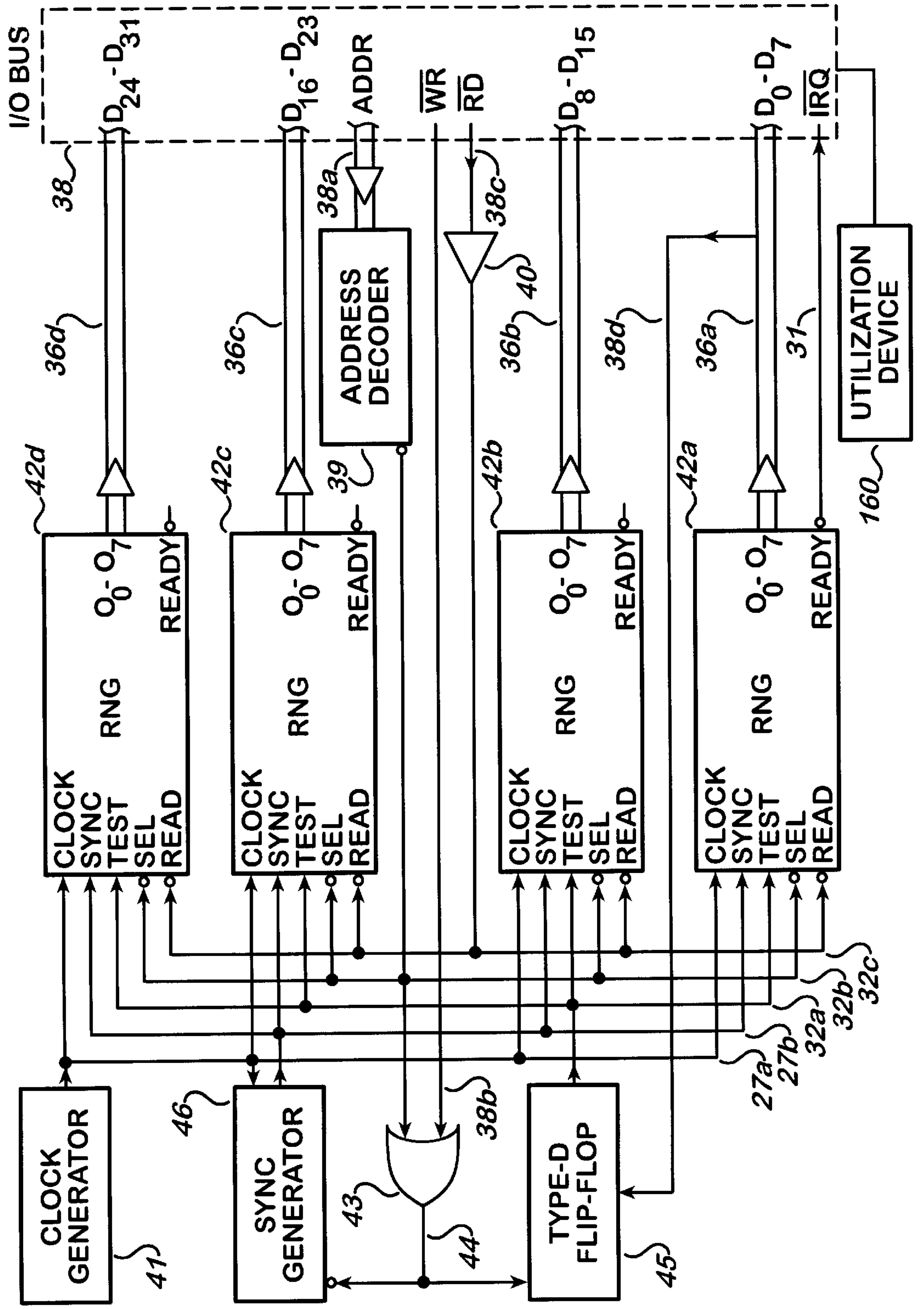
FIG. 16 is a schematic diagram of a complete system for synchronously generating 32-bit random numbers, comprising an array of four iterations of the RNG of FIG. 1 and timing, synchronization, and operational mode control means, interfaced with a utilization device.

Thus, a detailed description of the preferred embodiment of the RNG of the present invention has been set forth, involving a semiconductor noise source 21, a compressor 23, an A/D converter 28, and a reduction function 35, and including CLOCK 27*a,* SYNC 27*b,* TEST 32*a,* SEL# 32*b,* and READ# 32*c* inputs to and $O_0$–$O_7$ 36 and READY# 31 outputs from the RNG. A method and means of using these particular signals to provide random numbers to a utilization device 160 is shown in FIG. 16, which Figure is a diagram of a complete system for providing 32-bit random numbers involving a simple RNG array. The meanings of the names used for the well-known signals of the typical utilization device input/output (I/O) bus 38 are familiar to the art and need not be explained in detail.

As seen in FIG. 16, a clock generator 41 (e.g., an Epson SG-531P-12.288MC crystal oscillator) provides a clock signal 27*a* to an array of four RNGs, 42*a* through 42*d,* each in accordance with the preferred embodiment, and also to a synchronization pulse generator 46. Prior to enabling interrupts, the utilization device 160, e.g., a digital computer, initializes the RNG array by writing once either a 0 (for normal mode) or a 1 (for test mode) through bus 38. When the RNG address appears on I/O bus address lines 38*a,* address decoder 39 outputs a logic low on node 32*b,* which logic low is directed to the SEL# inputs of all four RNGs and also to one input of OR gate 43. In conjunction with a logic low asserted on I/O bus write line 38*b* from a write cycle, the OR gate output 44 is brought low, which performs two functions. Firstly, this asynchronously sets the output 27*b* of the sync generator 46 (e.g., 74ACT74 and 1/6 74ACT04) to logic high, which output is provided to all the RNGs and synchronizes them in a halted state. After the second of two high-to-low transitions of clock signal 27*a* is detected by the sync generator 46, the synchronization signal 27*b* is returned low and the RNGs, driven by a common clock, commence synchronized operation. Secondly, the state of I/O bus data bit $D_0$ 38*d* is stored in type-D flip-flop 45 on the low-to-high transition of OR gate output 44 (i.e., the low-to-high transition of 38*b*). The logic level of the bit stored in flip-flop 45 is provided on node 32*a* to the TEST input of all the RNGs, thus controlling the mode of operation of the array (i.e., normal or test).

After initialization, interrupts are enabled, so that when RNG 42*a* has valid data to output it will bring line 31 low, thus asserting an interrupt request. As the RNGs are synchronized, RNGs 42*b*–42*d* also have valid data at this time. An active low, buffered I/O read signal 32*c,* is provided by buffer 40 from the I/O bus read line 38*c* to all four RNGs. The utilization device's interrupt service routine initiates a read cycle with the RNG address that causes a logic low on 32*b* and 32*c,* so that all four RNGs simultaneously drive their respective 8-bit outputs on their output lines 36*a*–36*d,* and RNGs 42*a,* 42*b,* 42*c,* and 42*d* provide output data $O_0$–$O_7$ to I/O bus 38 data lines $D_0$–$D_7$, $D_8$–$D_{15}$, $D_{16}$–$D_{23}$, and $D_{24}$–$D_{31}$, respectively.

In the normal mode of operation, 32-bit uniformly distributed random numbers are thus provided on the I/O bus data lines $D_0$–$D_{31}$ by concatenating four 8-bit numbers. For the example clock generator and A/D converter, a 12.288 MHz clock generator will provide that each AD7722 operates at 192 kSPS, so that the output rate is (192,000 $sec^{-1}$)(32-bit)=6,144,000 bit/sec.

The test mode provides an expedient test for which the four bytes in the 32-bit double-word are, separately, normally distributed random numbers. Periodically, the RNGs should be placed in test mode, data collected (e.g., 1,000 samples), and means and standard deviations of the four one-byte variables computed separately. The most significant byte (MSB) of the 16-bit twos complement A/D converter output is an 8-bit twos complement variable (i.e., $-(80)_{16} \leqq [Y/(100)_{16}] \leqq (7F)_{16}$), so that the mean and standard deviation of the test data should be approximately 0 and 16, respectively, indicating that the mean and standard deviation of the converter output variable are approximately 0 and 4,096, respectively.

The signals 27*a,* 27*b,* 32*a,* 32*b,* and 32*c,* input to each RNG, comprise a timing and control bus that is connected identically to the inputs of the four RNGs in the array. Unlimited data-width expandability is provided by connecting additional RNGs to this bus to provide $D_{32}$–$D_{39}$, etc.

The RNGs here may contain one A/D converter per random noise source, with all the ADCs interfaced to one utilization device, e.g., a digital computer. Alternatively, analog multiplexing may be used to time-share one A/D converter with multiple sources. Also, as the random noise sources can provide much greater bandwidths than the ADCs can convert, one source may be time-shared with a set of interleaved ADCs. However, it will be appreciated that the alternative arrangements may make testing of the device so involved that any advantage may be negated.

The foregoing description sets forth a preferred embodiment of the invention. However, it should be appreciated from this description that the invention may be practiced in many different embodiments. For example, any source of a randomly varying voltage or current will provide an alternative noise source means (e.g., vacuum tube noise source). Some considerations in evaluating suitable alternative embodiments are as follows. For example, there exist integrated circuits, so-called "noise sources" which, in actuality, comprise a pseudo-random generator and a digital-to-analog converter. While such "noise sources" have practical uses, they are generally unsuitable for implementing the present invention. Any noise source means to be used in the invention should be thoroughly evaluated to verify the use of truly random phenomena. Alternative embodiments of the invention involving a noise source and A/D converter, but not including a reduction function, provide random sequences of non-uniform distributions. Whether or not a compressor is involved, both the standard deviation and mean of these sequences vary measurably. This is also the case if a 1-bit, approximately uniformly distributed output variable is obtained by using only the most significant bit of the A/D converter output. In this case, the A/D converter component is being used as comparator means which divides the noise distribution in two in order to provide a 1-bit random variable, and this is not in accordance with the spirit of the present invention. Therefore, it is preferred to obtain sequences of particular non-uniform distributions by, instead, performing well-known numerical transformations on uniformly distributed sequences provided by embodiments of the invention which include a reduction function. This has the additional advantage of greater versatility and any distribution over any interval may be provided by concatenating and/or discarding bits in the uniformly distributed sequences prior to applying the transformations.

Alternative embodiments of the invention comprising a noise source, A/D converter, and reduction function without compressor means are contemplated. For example, an RNG was assembled involving:

1. a semiconductor noise source such as shown in FIG. 10;
2. an 8-bit unipolar successive-approximation (i.e., resistive "ladder") A/D converter, in the form of a track-and-hold buffer and a successive approximation register; and
3. X=Y AND 1 for an M=2 reduction function.

This RNG was tested by subjecting the RNG output to Good's serial test (see Good, I. J., and Gover, T. N. The generalized serial test and the binary expansion of $\sqrt{2}$. Journal of the Royal Statistical Society A, 1967, 130, 102–7.). Probabilities for observed frequencies of overlapping strings in the outputted sequences were computed for strings of lengths one through eight. No correlation was detected.

In addition to the plurality of alternative embodiments suggested by simply varying the converter resolution and/or reduction function modulus, the reductive mapping process need not be modular reduction. For example, any embodiment involving a noise source, compressor, 16-bit A/D converter, and a reductive mapping process that outputs random sequences of the numbers 0, 1, . . . 255, may provide RNG biases approximately equal to that of the preferred embodiment by having the reduction function subject only to the condition that all particular y within each of 256 consecutive, equal subintervals of Y must map to a different x. There are $8\times10^{129,774}$ unique mathematical functions that satisfy this restriction. The preferred mapping process (i.e., yielding the least non-negative modular residue) is believed to be the most practical. Inasmuch as there exists a particular number of possible outputs from an RNG in accordance with the invention, that number shall be called the modulus of the reduction function, although the reductive mapping process need not be modular reduction. Furthermore, the number of particular y's that are mapped to a particular x need not be the same for all x. For example, it is contemplated that certain applications may benefit more from synchronous operation with a particular modulus that is not a divisor of the A/D converter scale, e.g., 6, 10, 12, 20, etc., than from a smaller bias with a modulus that is a divisor. The reduction function, then, is a digital circuit which maps values of an inputted variable, Y, to values of an outputted variable, X, for which the number, N, of values of Y is greater than the number, M, of values of X.

The suggested preference that the Nyquist Criterion be violated is in order to assure serial independence. For N>>M, attenuated high-frequency components may still provide serial independence, as long as the components are measurable by the A/D converter. A 16-bit A/D converter with full antialiasing was used as comparator means and as converter means, with 2-bit to 16-bit resolutions, in conjunction with a noise source, compressor, and M=2 reduction function, to test various embodiments of the invention. The unreduced comparator output (i.e., N=M=2) demonstrated substantial correlation. For 2-bit through 4-bit resolutions, the output distribution was rather non-uniform. For 5-bit through 16-bit resolutions, however, application of Good's serial test for string lengths of up to eight binary digits (the longest tested) showed no indication of correlation.

The A/D converter of the invention may be any circuit which will provide digital measurements of inputted analog noise. The A/D converter and reduction function may be combined to the degree that Y is not an encoded digital signal in the RNG. For example, a typical flash A/D converter involves N−1 comparators. Each comparator compares the analog input to one of N−1 voltages, and combinational logic encodes the value represented by the N−1 comparator outputs into a binary number, y. The A/D converter and reduction function may be combined by using logic that instead encodes the N−1 comparator outputs directly to an x, x≡y mod M, without an intermediate encoded y. An alternative A/D converter which may be suitable for particularly low-cost applications is one which times the discharge of a capacitor charged to a sampled voltage. A digitally-controlled analog switch initially allows a capacitor to track an analog input, and then the switch is opened so that the capacitor may slowly discharge through a fixed resistance while a digital counter increments. The time it takes for the capacitor voltage to decay from the sample voltage, $v_0$, to a fixed reference voltage, $v_{ref}$, is measured as a particular count, y, where y $\ln(v_{ref}/v_0)$. This circuit constitutes a non-linear A/D converter. By using a modulo-M counter, M<<N, y is still the number of counter increments during the decay, but y is not present as a digital signal in the apparatus, and the value stored in the counter upon completion of a conversion is x, where x≡y mod M. While the latter example ostensibly resembles various prior art methods which used randomly timed pulses to stop a modulo counter, there is a difference between the two. In the present invention, time intervals which represent random voltages or currents may be generated as an intermediate step in an alternative A/D conversion process involved in generating random numbers by reduction of voltage or current measurements. In contrast, the prior art may be described as generating random numbers by modular reduction of time interval measurements, which measurements were obtained directly from randomly timed phenomena, did not represent voltages or currents, and were not part of any A/D conversion process (e.g., time intervals between G-M tube counts or keystrokes). In the prior art methods, any random voltage or current variation are regarded as undesirable and eradicated by standardization circuitry, whereas random voltage or current variation is central to the present invention.

It will be appreciated by those of skill in the art that an RNG is provided by the present invention having many implementations and applications. Some examples of applications which benefit from random number sequences include: cryptographic systems for use in military, corporate, and personal applications; ayptanalysis; generation of passwords and other security combinations; software development; computer simulation and modeling; statistical and probabilistic numerical methods; and artificial intelligence. It is an advantage of the present invention that it now renders widespread application of RNGs not only feasible, but eminently practical. Specifically, an RNG in accordance with the invention may be constructed of commercially available parts that have a cost which is a trivial fraction of the cost of a personal computer, e.g., a semiconductor noise source, radio-frequency compressor, 16-bit 100,000 sample/sec A/D converter, and computer-bus interface logic that reduces data modulo-256. This example RNG is automatic, uses no radioactive material, requires no periodic calibration, and generates random numbers synchronously at a constant rate of 800,000 bit/sec with a bias of less than $3\times10^{-12}$, i.e., three parts per trillion. As further examples, RNGs may be provided which synchronously generate random numbers at 1,600,000 bit/sec (12-bit 400,000 sample/sec A/D converter, M=16) and 164,000,000 bit/sec (12-bit 41,000,000 sample/sec A/D converter, M=16). Biases were not computed for these examples.

The current state of the art in IC manufacture is amenable to having an RNG of the invention embodied in a single IC. The preferred embodiment is an "RNG-IC," comprising a semiconductor noise source, radio-frequency compression means, 16-bit 100,000 sample/sec A/D converter, and interface logic which reduces the converter output modulo-256 to provide 8-bit random numbers to the utilization device (bias $<3\times10^{-12}$). Installation of the RNG-IC on a personal computer motherboard as part of the standard chip-set would provide an unprecedented advantage to myriad computer applications. It is contemplated that the RNG-IC may also be included in the same package as a microprocessor and thus provide a built-in source of random numbers with access expedited by RNG-specific instructions. For large-scale use, arrays of RNG-ICs may be used to supersede pseudo-random algorithms, and further advantage the endeavor by freeing the computer resources those algorithms consume.

I claim:

1. A random number generator (RNG) comprising:

random noise source means for producing a random noise output;

analog-to-digital (A/D) converter means, coupled to said random noise source means, for converting said random noise output to a digital signal; and reduction function means, coupled to said A/D converter means, for subjecting said digital signal to a reductive mapping for generating uniformly distributed random numbers.

2. An RNG as in claim 1 wherein said digital signals represent numbers and said reduction function means reductively maps the numbers in said digital signal to the numbers generated as uniformly distributed random numbers.

3. An RNG as in claim 1 wherein said random noise source means comprises:

a semiconductor P-N junction; and means for applying a reverse-bias to said P-N junction for producing electronic noise as an output.

4. An RNG as in claim 3 further comprising:

amplifier means, coupled to said P-N junction, for outputting said electronic noise.

5. An RNG as in claim 1 wherein said A/D converter means comprises a sigma-delta A/D converter.

6. An RNG as in claim 1 wherein said A/D converter means comprises a track-and-hold buffer and a successive approximation register.

7. An RNG as in claim 1 further comprising:

compressor means, coupled between said random noise source means and said A/D converter means, for receiving said random noise output as an input and producing an approximately constant-level random noise output for input to said A/D converter.

8. An RNG as in claim 7 wherein said compressor means comprises:

controlled amplifier means for receiving said random noise output as an input and amplifying said input by a gain that is dependent on a control signal for producing an amplified output;

comparing means, including an error amplifier, coupled to said controlled amplifier means, for comparing said amplified output with a DC reference and producing an error signal; and means, coupled to said comparing means, for conditioning said error signal to produce said control signal for controlling the gain of said controlled amplifier means for rendering constant the level of said amplified output.

9. An RNG as in claim 7 wherein said compressor means comprises:

controlled attenuation means for receiving said random noise output as an input and attenuating said input by a factor that is dependent on a control signal for producing an attenuated output;

comparing means, including an error amplifier, coupled to said controlled attenuation means, for comparing said attenuated output with a DC reference and producing an error signal; and means, coupled to said comparing means, for conditioning said error signal to produce said control signal for controlling the attenuation factor of said controlled attenuation means for rendering constant the level of said attenuated output.

10. An RNG as in claim 7 wherein said compressor means comprises:

voltage controlled amplifier means for receiving said random noise output as an input and producing an output dependent on a control signal;

comparing means, including an error amplifier, coupled to said voltage controlled amplifier means, for comparing said output with a DC reference and producing an error signal; and means, coupled to said comparing means, for conditioning said error signal to produce said control signal for controlling the output of said voltage controlled amplifier means for rendering constant the level of said output.

11. A method for generating a uniformly distributed random variable comprising the steps of:

providing a random noise source for producing a first continuous random variable;

coupling said random noise source to an analog-to-digital (A/D) converter;

using said A/D converter to restrict said first continuous random variable to discrete values for producing a first discrete random variable Y;

selecting a reduction function that maps all N number of possible values of Y to a lesser M number of particular values; and using said function to transform Y to a second discrete random variable X, which random variable X is a uniformly distributed random variable.

12. The method of claim 11 wherein N is a finite number; and each value of Y is an integral multiple of the same quantity.

13. The method of claim 11 wherein N is an integer power of two.

14. The method of claim 11 wherein M is an integer power of two.

15. The method of claim 11 wherein M is a divisor of N.

16. The method of claim 11 wherein said reduction function includes at least one modular reduction.

17. A system for generating uniformly distributed random numbers comprising:

a source of random noise for producing a random noise output;

analog-to-digital (A/D) converter means, coupled to said source, for converting said random noise output to a digital signal;

interface means, coupled to said A/D converter means, for controlling the output of said digital signal; and digital computer means, coupled to said interface means, for utilizing said digital signal to obtain uniformly distributed random numbers.

18. A system as in claim 17 further comprising at least one amplifier coupled between said source and said A/D converter means.

19. A system as in claim 17 further comprising at least one compressor coupled between said source and said A/D converter means.

20. A system as in claim 17 wherein said interface means includes a reduction function for outputting the result of a reductive mapping of numbers represented by said digital signals.

21. A system as in claim 17 wherein said digital computer means includes a reduction function for transforming said digital signals to uniformly distributed random numbers.

* * * * *